US009362307B2

(12) United States Patent
Yamaguchi et al.

(10) Patent No.: US 9,362,307 B2
(45) Date of Patent: Jun. 7, 2016

(54) THIN FILM TRANSISTOR, ELECTRONIC DEVICE HAVING THE SAME, AND METHOD FOR MANUFACTURING THE SAME

(75) Inventors: Tetsuji Yamaguchi, Atsugi (JP); Kengo Akimoto, Atsugi (JP); Hiroki Kayoiji, Tochigi (JP); Toru Takayama, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 44 days.

(21) Appl. No.: 13/185,931

(22) Filed: Jul. 19, 2011

(65) Prior Publication Data

US 2011/0272700 A1 Nov. 10, 2011

Related U.S. Application Data

(62) Division of application No. 12/078,738, filed on Apr. 4, 2008, now Pat. No. 8,120,111, which is a division of application No. 10/821,197, filed on Apr. 9, 2004, now Pat. No. 7,374,981.

(30) Foreign Application Priority Data

Apr. 11, 2003 (JP) .................................. 2003-108479

(51) Int. Cl.
| | |
|---|---|
| *H01L 29/786* | (2006.01) |
| *H01L 21/84* | (2006.01) |
| *H01L 27/12* | (2006.01) |

(52) U.S. Cl.
CPC ............ *H01L 27/12* (2013.01); *H01L 27/1248* (2013.01)

(58) Field of Classification Search
CPC ........................ H01L 27/1203; H01L 27/1222
USPC .............................. 257/59, 72, 347–354, 524, 257/E27.111–E27.113, E29.285, E29.295, 257/E29.299; 313/498–512; 349/498–512
See application file for complete search history.

(56) References Cited

U.S. PATENT DOCUMENTS

| 5,120,667 A | 6/1992 | Tarui et al. |
| 5,241,192 A | 8/1993 | Possin et al. |

(Continued)

FOREIGN PATENT DOCUMENTS

| EP | 0 457 596 A | 11/1991 |
| JP | 59-130465 A | 7/1984 |

(Continued)

*Primary Examiner* — Marcos D Pizarro
(74) *Attorney, Agent, or Firm* — Eric J. Robinson; Robinson Intellectual Property Law Office, P.C.

(57) ABSTRACT

An object of the present invention is to provide a method for manufacturing a thin film transistor which enables heat treatment aimed at improving characteristics of a gate insulating film such as lowering of an interface level or reduction in a fixed charge without causing a problem of misalignment in patterning due to expansion or shrinkage of glass. A method for manufacturing a thin film transistor of the present invention comprises the steps of heat-treating in a state where at least a gate insulating film is formed over a semiconductor film on which element isolation is not performed, simultaneously isolating the gate insulating film and the semiconductor film into an element structure, forming an insulating film covering a side face of an exposed semiconductor film, thereby preventing a short-circuit between the semiconductor film and a gate electrode. Expansion or shrinkage of a glass substrate during the heat treatment can be prevented from affecting misalignment in patterning since the gate insulating film and the semiconductor film are simultaneously processed into element shapes after the heat treatment.

13 Claims, 7 Drawing Sheets

(56) References Cited

U.S. PATENT DOCUMENTS

| | | | |
|---|---|---|---|
| 5,650,339 A * | 7/1997 | Saito et al. | 438/164 |
| 5,997,286 A | 12/1999 | Hemsath et al. | |
| 6,271,065 B1 * | 8/2001 | Miyamoto et al. | 438/164 |
| 6,387,737 B1 | 5/2002 | Yamazaki et al. | |
| 6,459,124 B1 | 10/2002 | Zhang et al. | |
| 6,777,286 B2 | 8/2004 | Clevenger et al. | |
| 6,841,433 B2 | 1/2005 | Seo et al. | |
| 6,905,920 B2 | 6/2005 | Higashi et al. | |
| 7,098,087 B2 | 8/2006 | Akimoto et al. | |
| 7,109,073 B2 | 9/2006 | Yamazaki | |
| 7,118,780 B2 | 10/2006 | Yamazaki et al. | |
| 7,132,317 B2 | 11/2006 | Arao | |
| 7,132,375 B2 | 11/2006 | Yamazaki | |
| 7,211,502 B2 | 5/2007 | Yamazaki et al. | |
| 7,317,205 B2 | 1/2008 | Yamazaki et al. | |
| 7,323,368 B2 | 1/2008 | Takayama et al. | |
| 7,605,023 B2 | 10/2009 | Takayama et al. | |
| 7,674,663 B2 | 3/2010 | Yamazaki et al. | |
| 2007/0065995 A1 | 3/2007 | Arao | |

FOREIGN PATENT DOCUMENTS

| | | |
|---|---|---|
| JP | 03-068170 A | 3/1991 |
| JP | 04-139882 | 5/1992 |
| JP | 04-226080 A | 8/1992 |
| JP | 06-188421 | 7/1994 |
| JP | 06-244418 A | 9/1994 |
| JP | 2000-332254 A | 11/2000 |
| JP | 2002-033488 A | 1/2002 |
| JP | 2002-329868 A | 11/2002 |

* cited by examiner (A)

(B)

(C)

THIN FILM TRANSISTOR, ELECTRONIC DEVICE HAVING THE SAME, AND METHOD FOR MANUFACTURING THE SAME

BACKGROUND OF THE INVENTION

1. Field of the Invention

The present invention relates to a semiconductor element typified by a field effect transistor to be formed over a substrate having a low strain point and to a method for manufacturing the same, and relates to a semiconductor integrated circuit including the semiconductor element and to a method for manufacturing the same. Specifically, the present invention relates to a thin film transistor in which a gate insulating film is heat-treated at a temperature beyond a strain point of a substrate such as glass and to a method for manufacturing the same.

2. Description of Related Art

In recent years, development of a system-on-panel incorporating a logic circuit such as a CPU or a memory as well as a pixel or a driver circuit over a light transmitting insulating substrate such as glass or quartz has been attracting attention. High-speed operation is required for a driver circuit and a logic circuit, and manufacturing a thin film transistor (hereinafter, also referred to as a TFT) having high switching speed is required in order to realize it. It is effective for realizing a TFT having higher switching speed to use a semiconductor film with fewer crystal defects as an active layer, to make a gate insulating film thinner, and to miniaturize a transistor size typified by miniaturization of a gate length.

Characteristics required for a gate insulating film can be given as follows: few defects in a thin film; without a fixed charge; a low interface level with a semiconductor film; low leakage current; and the like. However, a gate leakage current tends to increase with a decrease in a film thickness of a gate insulating film. In addition, such a fine gate insulating film that can lower a gate leakage current is required in order to make the gate insulating film thinner. A field effect semiconductor device that can be driven with a low voltage and responds well to a high drive frequency can be obtained by making the gate insulating film thinner.

Patent Document 1: Japanese Patent Laid-Open No. H6-188421

SUMMARY OF THE INVENTION

In the case of forming a silicon film over a transparent insulating substrate such as glass and manufacturing an integrated circuit by using the silicon film, a manufacturing technique developed in a large-scale integrated circuit using a single crystal silicon substrate cannot be diverted directly. This is because a processing temperature is restricted in terms of heat resistance of glass or the like that is a substrate over which an integrated circuit is formed as well as because of a crystallinity problem of a silicon film (polycrystalline silicon film or the like) for manufacturing an integrated circuit.

A gate insulating film which is fine and has good electrical adequacy can be formed by a CVD method, but a film formation temperature is required to be equal to or more than 750° C. A plasma CVD method makes it possible to form a film at a low temperature; however, it is a problem that a film is damaged by a charged particle in plasma and a defect or a pinhole is easily caused. Further, in the case that a film formation temperature is equal to or less than 500° C., hydrogen is included within a film and film stability is decreased. On the contrary, a radio frequency sputtering method can form a thin film without hydrogen contamination. However, a film fine enough to be generally used as a gate insulating film is not obtained by a radio frequency sputtering method in comparison with a CVD method.

Miniaturization of an element size is further required to manufacture a TFT having high switching speed that is essential for an element of a logic operation circuit and to obtain higher integration. A high-quality gate insulating film is essential to be formed to achieve the miniaturization. The gate insulating film is preferably heat-treated after the formation in order to form a high-quality gate insulating film. However, a substrate such as glass that expands or shrinks before or after applying a temperature above a strain point has a problem that misalignment occurs in patterning a film formed over the substrate. Therefore, it is difficult to heat-treat a gate insulating film at a temperature above a strain point of the substrate.

A typical step of manufacturing a TFT over a glass substrate is described with reference to FIG. 7. FIGS. 7(E) to 7(H) are top views, and FIGS. 7(A) to 7(D) are cross-sectional views along broken lines A-B and broken lines B-C in the respective top views. In FIG. 7, steps of from forming a semiconductor film, element isolation to manufacturing a gate electrode are particularly described.

First, a base film 11 and a semiconductor film 12 are formed over an insulating substrate 10 (FIGS. 7(A) and 7(E)). Subsequently, element isolation is performed by processing the semiconductor film 12 into island shapes to form a transistor formation region 13 and a transistor formation region 14 (FIGS. 7(B) and 7(F)). Subsequently, a gate insulating film 15 and a conductive film 16 are formed (FIGS. 7(C) and 7(G)). Lastly, the conductive film 16 is patterned to form a gate electrode 18 (FIGS. 7(D) and 7(H)). Note that a region of the gate insulating film 15 which is not overlapped with the gate electrode 18 is etched by etching in forming the gate electrode 18, and it becomes a gate insulating film 17.

As described above, element isolation is performed on the semiconductor film 12 to be island shapes; then, the gate insulating film 15 and the conductive film 16 are formed. Thereafter, the conductive film 16 is patterned with the gate electrode 18 positioned to island-shaped semiconductor films, that is, the transistor formation regions 13 and 14; thus, a transistor is formed. In this method, an upper limit of a process temperature after processing the semiconductor film 12 into island shapes is determined by considering shrinkage of the substrate so that a defect due to misalignment in patterning is not caused.

It is an object of the present invention to provide a thin film transistor which enables heat treatment aimed at improving characteristics of a gate insulating film such as lowering of an interface level or reduction in a fixed charge without causing a problem of misalignment in patterning due to expansion or shrinkage of a substrate such as glass and to provide a method for manufacturing the same.

Means to Solve the Problem

An invention of this specification is a thin film transistor comprising: an island-shaped semiconductor film and an island-shaped gate insulating film patterned by using the same photomask over an insulating substrate; a side wall made of an insulating material formed on a side face of the island-shaped semiconductor film; and a gate electrode formed over the island-shaped gate insulating film, characterized in that the gate electrode overlaps the side face of the island-shaped semiconductor film with the side wall therebetween.

An invention of this specification is a thin film transistor comprising: an island-shaped semiconductor film and an island-shaped gate insulating film patterned by using the same photomask over an insulating substrate; a side wall made of an insulating material formed on side faces of the island-shaped semiconductor film and the island-shaped gate insulating film; and a gate electrode formed over the island-shaped gate insulating film, characterized in that the gate electrode overlaps the side face of the island-shaped semiconductor film with the side wall therebetween.

An invention of this specification is a thin film transistor comprising: an island-shaped semiconductor film and an island-shaped gate insulating film patterned by using the same photomask over an insulating surface; and a gate electrode formed over the island-shaped gate insulating film, characterized in that a side face of the island-shaped semiconductor film is insulated, and the gate electrode overlaps the insulated side face of the island-shaped semiconductor film.

An invention of this specification is a thin film transistor comprising: an island-shaped semiconductor film and an island-shaped gate insulating film patterned by using the same photomask over an insulating substrate; an insulating film patterned to cover side faces of the island-shaped semiconductor film and the island-shaped gate insulating film and only a peripheral portion of a top face of the island-shaped gate insulating film; and a gate electrode formed over the island-shaped gate insulating film, characterized in that the gate electrode overlaps the side face of the island-shaped semiconductor film with the insulating film patterned to cover the side faces of the island-shaped semiconductor film and the island-shaped gate insulating film and only the peripheral portion of the top face of the island-shaped gate insulating film therebetween.

An invention of this specification is a method for manufacturing a thin film transistor, characterized by comprising the steps of: forming a semiconductor film over an insulating substrate; forming a first insulating film over the semiconductor film; heat-treating the semiconductor film and the first insulating film; forming an island-shaped semiconductor film and an island-shaped gate insulating film by patterning the semiconductor film and the first insulating film into island shapes with the use of the same photomask after the heat treatment; forming a second insulating film over the island-shaped gate insulating film; forming a side wall covering a side face of the island-shaped semiconductor film and a side face of the island-shaped gate insulating film in a self-aligned manner by anisotropically etching the second insulating film; forming a conductive film over the island-shaped gate insulating film after forming the side wall; and forming a gate electrode by patterning the conductive film.

An invention of this specification is a method for manufacturing a thin film transistor, characterized by comprising the steps of: forming a semiconductor film over an insulating substrate; forming an insulating film over the semiconductor film; heat-treating the semiconductor film and the insulating film; forming an island-shaped semiconductor film and an island-shaped gate insulating film by patterning the semiconductor film and the insulating film into island shapes with the use of one resist mask after the heat treatment; insulating a side face of the semiconductor film by adding oxygen or nitrogen to the side face of the island-shaped semiconductor film without removing the resist mask; forming a conductive film over the island-shaped gate insulating film; and forming a gate electrode by patterning the conductive film.

An invention of this specification is a method for manufacturing a thin film transistor, characterized by comprising the steps of: forming a semiconductor film over an insulating substrate; forming a first insulating film over the semiconductor film; heat-treating the semiconductor film and the first insulating film; forming an island-shaped semiconductor film and an island-shaped gate insulating film by patterning the semiconductor film and the first insulating film into island shapes with the use of one photomask after the heat treatment; forming a second insulating film over the island-shaped gate insulating film; patterning the second insulating film to cover edge portions of the island-shaped semiconductor film and the island-shaped gate insulating film and only a peripheral portion of a top face of the island-shaped gate insulating film; forming a conductive film over the island-shaped gate insulating film; and forming a gate electrode by patterning the conductive film.

An invention of this specification is a method for manufacturing a thin film transistor, characterized by comprising the steps of: forming a semiconductor film over an insulating substrate; forming a first insulating film on the semiconductor film; forming a first conductive film over the first insulating film; heat-treating the semiconductor film, the first insulating film, and the first conductive film; forming an island-shaped semiconductor film, an island-shaped gate insulating film, and a first island-shaped conductive film by patterning the semiconductor film, the first insulating film, and the first conductive film into island shapes with the use of the same photomask after the heat treatment; forming a second insulating film over the first island-shaped conductive film; forming a side wall covering a side face of the island-shaped semiconductor film, a side face of the island-shaped gate insulating film, and a side face of the first island-shaped conductive film in a self-aligned manner by anisotropically etching the second insulating film; forming a second conductive film over the first island-shaped conductive film after forming the side wall; and forming a gate electrode by patterning the first island-shaped conductive film and the second conductive film.

An invention of this specification is a method for manufacturing a thin film transistor, characterized by comprising the steps of: forming a semiconductor film over an insulating substrate; forming an insulating film over the semiconductor film; forming a first conductive film over the insulating film; heat-treating the semiconductor film, the insulating film, and the first conductive film; forming an island-shaped semiconductor film, an island-shaped gate insulating film, and a first island-shaped conductive film by patterning the semiconductor film, the insulating film, and the first conductive film into island shapes with the use of the same resist mask after the heat treatment; insulating a side face of the semiconductor film by adding oxygen or nitrogen to the side face of the island-shaped semiconductor film without removing the resist mask; forming a second conductive film over the first island-shaped conductive film; and forming a gate electrode by patterning the first island-shaped conductive film and the second conductive film.

An invention of this specification is a method for manufacturing a thin film transistor, characterized by comprising the steps of: forming a semiconductor film over an insulating substrate; forming a first insulating film over the semiconductor film; forming a first conductive film over the insulating film; heat-treating the semiconductor film, the first insulating film, and the first conductive film; forming an island-shaped semiconductor film, an island-shaped gate insulating film, and a first island-shaped conductive film by patterning the semiconductor film, the first insulating film, and the first conductive film into island shapes with the use of the same photomask after the heat treatment; forming a second insulating film over the first island-shaped conductive film; patterning the second insulating film to cover edge portions of the island-shaped semiconductor film, the island-shaped gate insulating film, and the first island-shaped conductive film and only a peripheral portion of a top face of the first island-shaped conductive film; forming a second conductive film over the island-shaped gate insulating film; and forming a gate electrode by patterning the first conductive film and the second conductive film.

A method for manufacturing a thin film transistor according to the invention of this specification further is characterized by comprising the steps of: heat-treating in a state where at least a gate insulating film is formed over a semiconductor film on which element isolation is not performed; isolating the gate insulating film and the semiconductor film into an element structure by using one photomask after the heat treatment; forming an insulating film covering a side face of an exposed semiconductor film; and forming a gate electrode over the gate insulating film. Expansion or shrinkage of a substrate such as glass during the heat treatment can be prevented from affecting misalignment in patterning since the gate insulating film and the semiconductor film are simultaneously patterned and processed into element shapes after the heat treatment. The side face of the semiconductor film is exposed in a condition that the gate insulating film and the semiconductor film are simultaneously patterned and processed into element shapes. Then, one feature is that an insulating film covering the side face of the semiconductor film is formed before forming an electrode such as a gate electrode or a wiring over the gate insulating film. Thus, a short circuit is prevented between the semiconductor film that is processed into an element structure and an electrode or a wiring to be formed over the gate insulating film.

In the invention of this specification, a substrate having a lower strain point than a heat treatment temperature of from 600° C. to 800° C. to be applied to a gate insulating film is effectively used as an insulating substrate over which a thin film transistor is formed, regardless of its type.

Further, a laminated film of a semiconductor film and a gate insulating film on which element isolation is not performed is simultaneously heat-treated in the invention of this specification. Furnace or RTA (Rapid Thermal Anneal) may be used for the heat treatment. Either gas heating or lamp heating can be used in RTA treatment. Preferably, lamp heating treatment may be performed with up to a conductive film for forming at least one part of a gate electrode formed over the laminated film. In the case of using a halogen lamp having a peak of an emitted spectrum in an infrared region, the conductive film effectively absorbs emitted light. Not only can the gate insulating film be effectively heated, but also an interface between the gate insulating film and the conductive film can be heat-treated. Consequently, characteristics such as reduction in a leakage current resulting from the interface between the gate electrode and the gate insulating film can be improved.

A side face of the semiconductor film is exposed in the case of simultaneously performing element isolation on the laminated film including the semiconductor film and the gate insulating film. Therefore, the side face of the semiconductor film is short-circuited with the gate electrode in the case of successively forming a conductive film for forming the gate electrode. Particularly, the side face of the semiconductor film and a portion for leading the gate electrode outside the semiconductor film on which element isolation is performed are short-circuited. Then, an insulating film covering the side face of the semiconductor film is required. The insulating film covering the side face of the semiconductor film can be formed by forming an insulating film covering an entire surface of the substrate over patterned semiconductor film and gate insulating film, anisotropically etching the insulating film, and processing into a side wall shape in a self-aligned manner. In addition, a method for insulating the side face of the semiconductor film at a low temperature or a method for patterning the insulating film to cover side faces of the semiconductor film and the gate insulating film and only a peripheral portion of a top face of the gate insulating film is given as another method for forming the insulating film covering the side face of the semiconductor film. The insulating film covering the side face of the semiconductor film can be formed to have higher precision since there is no misalignment in the case of forming in a self-aligned manner. Therefore, in the case of intending integration, it is preferable to manufacture the insulating film by a method for forming into a side wall shape or a method for insulating the side face of the semiconductor film at a low temperature. In this way, the insulating film is formed only on a desired side face of a semiconductor film.

According to the present invention having the above structures, a gate insulating film can be heat-treated without a problem of an alignment defect in patterning even at a temperature of 700° C. that conventionally causes a problem of misalignment in patterning due to shrinkage of a substrate such as glass.

In the present invention, a gate insulating film can be heat-treated at a temperature of 700° C. above a strain point of a substrate such as glass. Therefore, an interface level is lowered; a fixed charge is reduced; a gate leakage current is lowered; field-effect mobility, subthreshold coefficient, and the like become favorable; a change of transistor characteristics over time during continuous operation can be reduced; a yield is improved; and variation in the characteristics is reduced, in a thin film transistor.

EMBODIMENT OF THE INVENTION

Embodiment Mode 1

A glass substrate made of a material such as barium borosilicate glass, alumino borosilicate glass, or aluminosilicate glass, or the like can be given as a substrate which can be applied in this embodiment mode. Typically, a 1737 glass substrate (strain point: 667° C.) manufactured by Corning, Inc., AN100 (strain point: 670° C.) manufactured by Asahi Glass Co., Ltd., or the like can be applied, but there is no particular limitation on other similar substrates.

Figure 1:
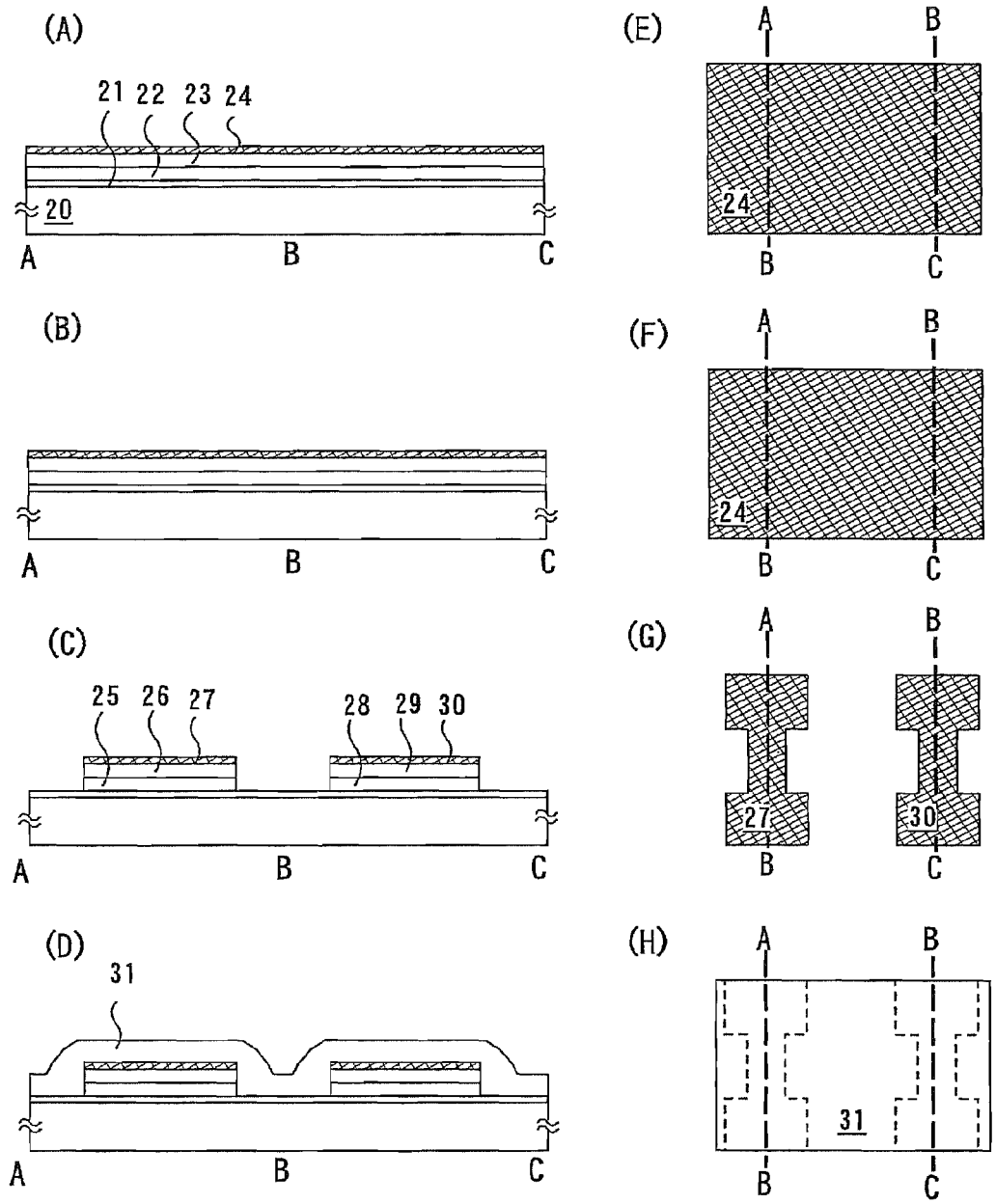
FIGS. 1A-1H are diagrams showing a step of manufacturing a thin film transistor of the present invention.

A first inorganic insulating layer 21 made of an insulating film such as a silicon oxide film, a silicon nitride film, or a silicon oxynitride film (SiOxNy) is formed over a glass substrate 20, as shown in FIGS. 1(A) and 1(E), using the above substrate. A typical example of the first inorganic insulating layer 21 has a two-layer structure, which is a structure where a first silicon oxynitride film formed to be 50 nm in thickness by a plasma CVD method using $SiH_4$, $NH_3$, and $N_2O$ as a reactive gas and a second silicon oxynitride film formed to be 100 nm in thickness by a plasma CVD method using $SiH_4$ and $N_2O$ as a reactive gas are laminated.

A crystalline semiconductor film 22 serving as an active layer of a TFT is obtained by crystallizing an amorphous semiconductor film formed over the first inorganic insulating layer 21. A crystalline silicon film or the like can be used for the crystalline semiconductor film 22. Thickness of the amorphous semiconductor film is selected in the range where thickness of the crystalline semiconductor film 22 obtained by crystallizing the amorphous semiconductor film is to be from 20 nm to 60 nm. An upper limit of the film thickness of the crystalline semiconductor film 22 serving as an active layer of a TFT is a maximum value for operating as a fully depleted type in a channel region of a TFT. A lower limit of the film thickness is a limitation on a process, and is set as a minimum value required in selectively processing only the crystalline semiconductor film 22 during an etching step of the crystalline semiconductor film 22.

A gate insulating film 23 is formed over the crystalline semiconductor film 22. A silicon oxide film formed by a reactive sputtering method using Ar and $O_2$ and utilizing a Si target, a silicon oxynitride film formed by a CVD method using $SiH_4$, $NH_3$, and $N_2O$ as a reactive gas, or the like can be used for the gate insulating film 23. The gate insulating film 23 is not limited to a silicon compound, and high dielectric constant metal oxide that has a higher dielectric constant than that of silicon oxide and by which an effect of making the gate insulating film thinner is effectively obtained may be used. Effective film thickness can be expressed as a product $t \cdot k_1/k_2$ of actual film thickness t and ratio $k_1/k_2$ of a relative dielectric constant $k_1$ of a film material to be a benchmark such as silicon oxide to a relative dielectric constant $k_2$ of an actual film material. Note that a film thickness of the gate insulating film 23 is set by a scaling law and a process margin, and the thickness of the gate insulating film 23 is set to be from 20 nm to 80 nm in order to manufacture a TFT with a gate length of from 0.35 μm to 2.5 μm here.

Subsequently, a first conductive film 24 is formed over the gate insulating film 23. A tantalum nitride film is formed by reactive sputtering using Ar and $N_2$ gas and utilizing a Ta target to have a film thickness of from 10 nm to 50 nm for the first conductive film 24. Another conductive film as well as a tantalum compound may be used for the first conductive film 24. However, the first conductive film 24 is preferably a material that absorbs light within a wavelength of approximately 1 μm and a material that can have an enough selective ratio in etching with a second conductive film 34 to be formed later.

Subsequently, the crystalline semiconductor film 22, the gate insulating film 23, and the first conductive film 24 are heat-treated, as shown in FIGS. 1(B) and 1(F). RTA treatment that is capable of heating and cooling instantaneously is employed as heat treatment. A temperature rises up to a temperature of from 600° C. to 800° C. in 10 seconds to 120 seconds, and heat treatment is performed at a temperature of from 600° C. to 800° C. for 30 seconds to 180 seconds in RTA treatment. Note that there are a gas heating method using a heated gas and a lamp heating method by emission of a lamp as the RTA treatment. The glass substrate 20 itself is heated by a gas in the case of the gas heating method, and the gate insulating film 23 can be heat-treated. However, temperature rising efficiency is generally remarkably inefficient in the lamp heating method. This is because the glass substrate 20 itself is hard to be heated since a typical halogen lamp has a peak of an emitted spectrum at approximately 1 μm and the glass substrate 20 does not sufficiently absorb light within such a wavelength region by itself. In this embodiment mode, heat conduction to the gate insulating film 23 occurs by using a tantalum nitride film as an absorber layer since the tantalum nitride film that is the first conductive film 24 absorbs light within a wavelength of approximately 1 μm. Consequently, the gate insulating film 23 can be efficiently heat-treated. Note that the heat treatment is performed at a temperature above the strain point of glass, and shrinkage of the glass substrate 20 is caused. However, a patterning defect due to the shrinkage is not caused in a later step since the crystalline semiconductor film 22 is not processed into an element shape yet at the time of the heat treatment.

Subsequently, the crystalline semiconductor film 22, the gate insulating film 23, and the first conductive film 24 are collectively etched into island shapes by using the same photomask, as shown in FIGS. 1(C) and 1(G). For example, an ICP (Inductively Coupled Plasma) etching method can be applied as an etching method. A mixed gas of CF4 and Cl2 can be used as an etching gas in etching the first conductive film 24 made of a tantalum nitride film. A $CHF_3$ gas can be used for etching the gate insulating film 23 made of a silicon oxide film, and a mixed gas of CF4 and O2 can be used in etching the crystalline semiconductor film 22 made of a crystalline silicon film. Thus, a crystalline semiconductor film 25 and a crystalline semiconductor film 28 which are processed into island shapes, a gate insulating film 26 and a gate insulating film 29 which are processed into island shapes, and a first conductive film 27 and a first conductive film 30 which are processed into island shapes are formed.

Subsequently, an insulating film 31 covering an entire surface of the glass substrate 20 is formed to cover exposed side faces of the crystalline semiconductor film 25 and the crystalline semiconductor film 28 as shown in FIGS. 1(D) and 1(H). A silicon oxide film formed by a low pressure CVD method which isotropically grows to have a film thickness of from 500 nm to 1.5 μm is used as the insulating film 31. Note that the insulating film 31 is only necessary to be an insulating film, and a silicon nitride film or a silicon oxynitride film can be used without being limited to the silicon oxide film.

Figure 2:
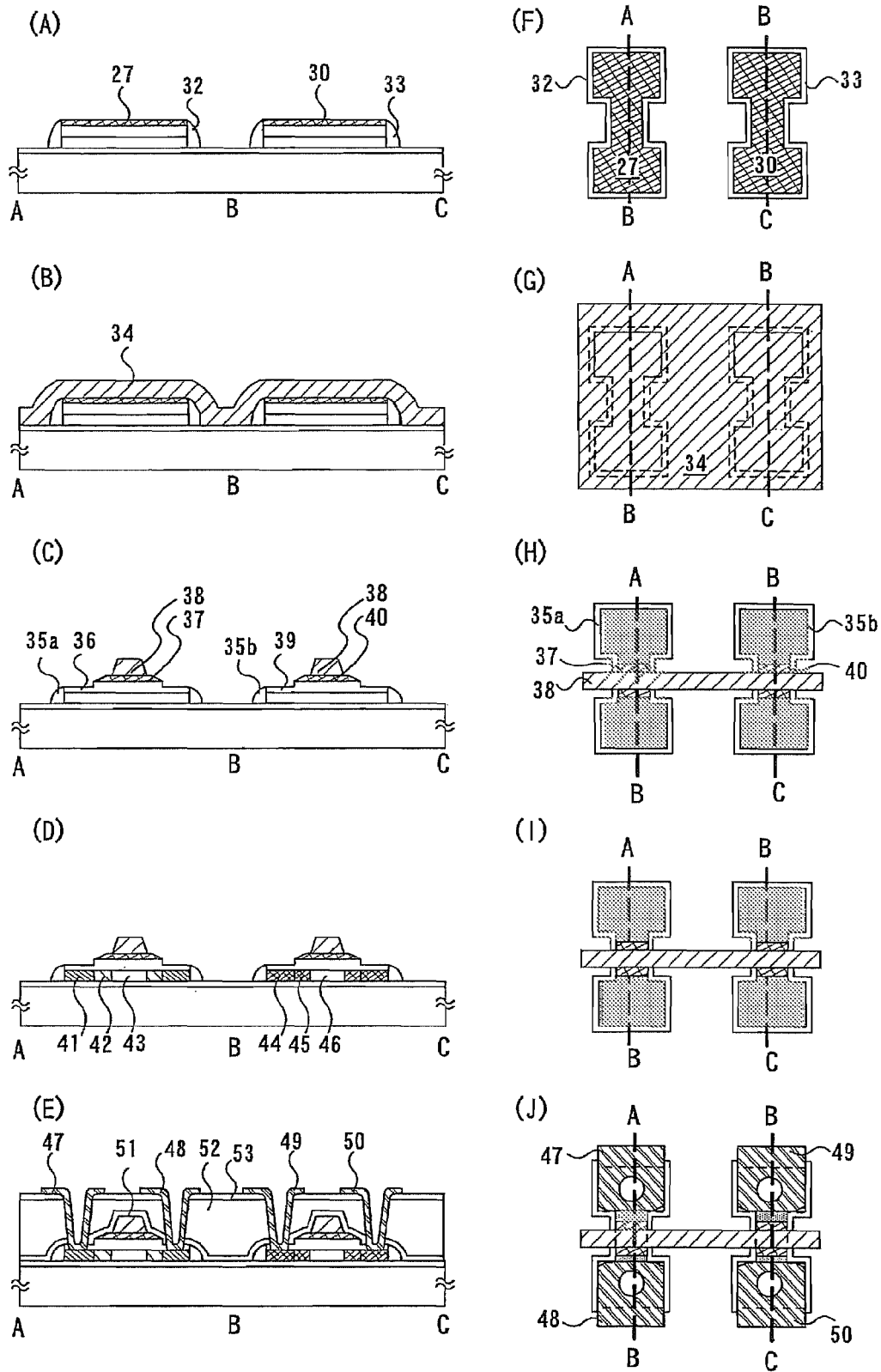
FIGS. 2A-2J are diagrams showing a step of manufacturing a thin film transistor of the present invention.

Subsequently, a side wall 32 and a side wall 33 covering side faces of the crystalline semiconductor film 25 and the crystalline semiconductor film 28 and side faces of the gate insulating film 26 and the gate insulating film 29 can be formed as shown in FIGS. 2(A) and 2(F) by applying a predetermined bias voltage to a glass substrate 20 side and anisotropically etching the insulating film 31 made of a silicon oxide film. Effective thickness of the side wall 32 and the side wall 33 in a portion covering the side faces of the crystalline semiconductor film 25 and the crystalline semiconductor film 28 in a direction perpendicular to the side faces is set equal to or thicker than effective thickness of the gate insulating film 26 and the gate insulating film 29. For instance, when all the gate insulating film 26, the gate insulating film 29, the side wall 32, and the side wall 33 are made of silicon oxide films, thickness of the side wall 32 and the side wall 33 in a portion covering the side faces of the crystalline semiconductor film 25 and the crystalline semiconductor film 28 in a direction perpendicular to the side faces is set at equal to or more than from 20 nm to 80 nm that is thickness of the gate insulating film 26 and the gate insulating film 29. In this way, a short circuit and a current leakage can be suppressed between a portion for leading a gate electrode outside the semiconductor film on which element isolation is performed and the side faces of the crystalline semiconductor film 25 and the crystalline semiconductor film 28.

Then, a second conductive film 34 shown in FIGS. 2(B) and 2(G) is formed. A tungsten film having a film thickness of from 300 nm to 500 nm is used as the second conductive film 34 in this embodiment mode. The second conductive film 34 is not limited to a tungsten film, and is only necessary to be a conductive film. However, a material having an enough selective ratio in etching with the first conductive film 24 is preferably used for the second conductive film 34.

A first conductive layer 37 and a first conductive layer 40 made of tantalum nitride and a second conductive layer 38 made of tungsten, which are processed into a shape of a gate electrode, are obtained by etching the first conductive film 24 and the second conductive film 34, as shown in FIGS. 2(C) and 2(H). Here, a structure in which the first conductive layer 37, the first conductive layer 40, and the second conductive layer 38 have different tilt angles in edge portions is manufactured. The first conductive layer 37, the first conductive layer 40, and the second conductive layer 38 having different tilt angles in the edge portions are formed by performing two-stage etching treatment on the first conductive film 24 and the second conductive film 34. In the first stage of etching, both tungsten and tantalum nitride are simultaneously etched by applying a predetermined voltage to the glass substrate 20 with the use of a mixed gas of $CF_4$, $Cl_2$, and $O_2$ as an etching gas, and a layer made of tungsten and a layer made of tantalum nitride having the same tilt angles in edge portions are manufactured. Subsequently, in the second stage of etching, only the layer made of tungsten is anisotropically etched by applying a predetermined bias voltage to the glass substrate 20 under the first stage etching condition in which the etching gas is replaced with $SF_6$, $Cl_2$, and $O_2$. In this way, the first conductive layer 37, the first conductive layer 40, and the second conductive layer 38 having different tilt angles in the edge portions are formed. Note that the gate insulating film 26, the gate insulating film 29, the side wall 32, and the side wall 33 are also etched to be a gate insulating film 36, a gate insulating film 39, a side wall 35a, and a side wall 35b respectively in a process of etching the first conductive layer 37, the first conductive layer 40, and the second conductive layer 38.

Then, a desired quantity of impurities is doped. 41 and 44 in FIGS. 2(D) and 2(I) become a source or a drain doped with an n-type or a p-type impurity in high concentration respectively; 42 and 45 become doping regions doped with an n-type impurity in lower concentration than those in the source or drain 41 and the source or drain 44 (Gate Overlapped Lightly Doped Drain) since they are doped through the edge portions of the first conductive layer 37 and the first conductive layer 40 that are parts of the gate electrodes; and 43 and 46 become channel regions.

Thereafter, as shown in FIGS. 2(E) and 2(J), a silicon oxynitride film containing hydrogen is formed as an insulating film 51 to have a film thickness of 100 nm by a plasma CVD method, and the crystalline semiconductor film 25, the crystalline semiconductor film 28, the gate insulating film 36, and the gate insulating film 39 are hydrogenated by heat-treating at 410° C. Further, a silicon oxide film is formed as an interlayer insulating film 52 to have a film thickness of from 400 nm to 600 nm by a CVD method. Note that phosphorous glass (PSG), boron phosphorous glass (BSG), or phosphorous boron glass (PBSG) can be applied to the interlayer insulating film 52. A porous film or a low dielectric constant film such as acrylic of an organic resin system or Teflon (registered trademark) can be used as the interlayer insulating film 52 as well. Then, a silicon nitride film is formed as a barrier film 53 to have a film thickness of 100 nm by a sputtering method. In the next place, a wiring 47, a wiring 48, a wiring 49, and a wiring 50 are formed after forming contact portions to reach the source or drain 41 and the source or drain 44 by etching the barrier film 53, the interlayer insulating film 52, the insulating film 51, the gate insulating film 36, and the gate insulating film 39. A laminate structure of a titanium film with a thickness of 60 nm, a titanium nitride film with a thickness of 40 nm, an aluminum film with a thickness of 300 nm, and a titanium film with a thickness of 100 nm is used for the wirings 47 to 50. However, a structure of the wirings 47 to 50 is not limited to the above structure, and copper can be used in place of aluminum. A film in contact with the aluminum film is not limited to titanium nitride, and tantalum nitride, tungsten nitride, or the like can be used in the wirings 47 to 50.

Embodiment Mode 2

Figure 3:
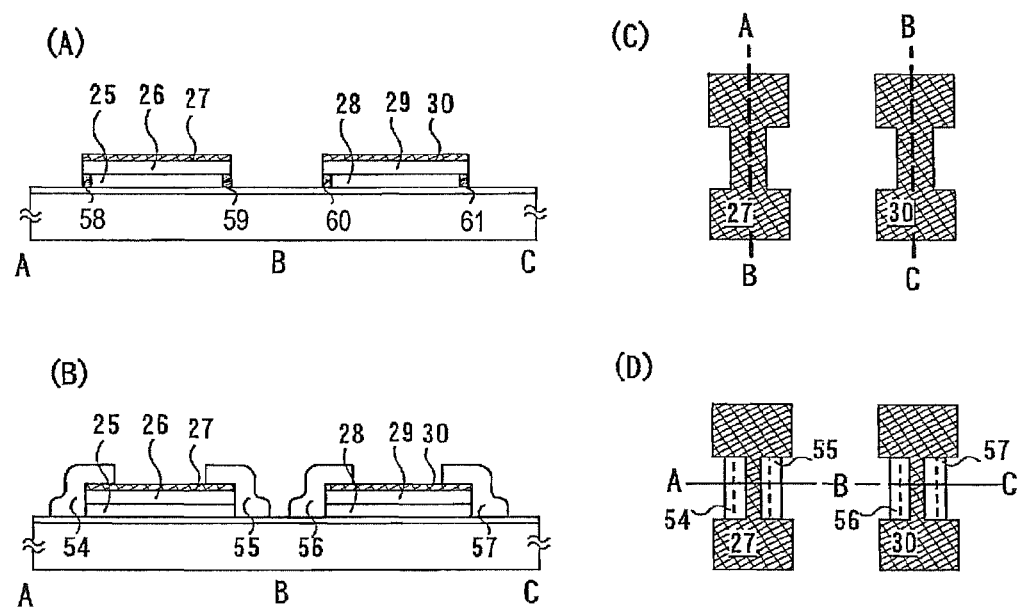
FIGS. 3A-3D are diagrams showing a step of manufacturing a thin film transistor of the present invention.

Ozone is used at a temperature of 500° C. to oxidize the crystalline semiconductor film 25, the crystalline semiconductor film 28, the gate insulating film 26, the gate insulating film 29, the first island conductive film 27, and the first island conductive film 30 which are processed into island shapes as shown in FIGS. 1(C) and 1(G) in Embodiment Mode 1. Thus, oxide films are formed on exposed side faces of the crystalline semiconductor film 25 and the crystalline semiconductor film 28, and effective thickness of the oxide films is set equal to or thicker than effective thickness of the gate insulating film 26 and the gate insulating film 29 as shown in FIGS. 3(A) and 3(C), thereby preventing a short circuit between a gate electrode to be formed later and the side faces of the crystalline semiconductor film 25 and the crystalline semiconductor film 28. Note that an oxide film, a nitride film, an oxynitride film, or the like can be used as an insulating film 58-61 to be formed on the side faces of the crystalline semiconductor film 25 and the crystalline semiconductor film 28. Plasma oxidization as well as a method using an ozone gas can be performed by using plasma including oxygen as an oxidation method. In addition, washing by using ozone water may be performed as an oxidation method, and in this case, oxidation can be performed efficiently by irradiating a surface of the glass substrate 20 with ultraviolet light. Plasma nitriding can be performed by using plasma including a nitrogen gas as a nitriding method. Further, only the side faces of the crystalline semiconductor film 25 and the crystalline semiconductor film 28 can be selectively made insulative by doping oxygen or nitrogen with a resist mask used in patterning the island-shaped crystalline semiconductor film 25, the island-shaped crystalline semiconductor film 28, the gate insulating film 26, the gate insulating film 29, the first conductive film 27, and the first conductive film 30 remained.

Embodiment Mode 3

An insulating film is formed over an entire surface of the glass substrate 20 to cover the crystalline semiconductor film 25, the crystalline semiconductor film 28, the gate insulating film 26, and the gate insulating film 29 after forming the crystalline semiconductor film 25, the crystalline semiconductor film 28, the gate insulating film 26, the gate insulating film 29, the first conductive film 27, and the first conductive film 30 which are processed into island shapes as shown in FIGS. 1(C) and 1(G) in Embodiment Mode 1. A silicon oxide film formed to have a thickness of from 50 nm to 100 nm by a CVD method is used as the insulating film. The insulating film is not limited to the silicon oxide film formed by a CVD method, and a silicon nitride film, a silicon oxynitride film, or the like can be used. A film formation method is also not limited to a CVD method, and a sputtering method, or the like can be applied. Then, the insulating film is patterned to form insulating layers 54 to 57 as shown in FIGS. 3(B) and 3(D). The insulating layers 54 to 57 are shaped to cover side faces of the island-shaped crystalline semiconductor film 25 and the island-shaped crystalline semiconductor film 28 in a region overlapped with at least a gate electrode to be formed later, and effective thickness of the insulating layers 54 to 57 is set equal to or thicker than effective thickness of the gate insulating film 26 and the gate insulating film 29, thereby preventing a short circuit between the crystalline semiconductor film 25 and the crystalline semiconductor film 28 and the gate electrode to be formed later.

Embodiment

Embodiment 1

A cross-sectional structure in the case of manufacturing a display device by using a typical thin film transistor manufactured according to Embodiment Modes 1 to 3 is described.

A TFT disposed in a driver circuit portion and a pixel portion is formed over a substrate 500 having an insulating surface according to manufacturing steps described in the above embodiment modes. Thereafter (FIG. 4(A)), a first electrode 501 made of a transparent conductive film is formed to electrically connect with a wiring 507 of a driving TFT 513. The transparent conductive film is preferably made of a material having a high work function, and the following can be given as an example thereof: a compound of indium oxide and tin oxide (ITO); a compound of indium oxide and zinc oxide; zinc oxide; tin oxide; indium oxide; titanium nitride; or the like. In this embodiment, an ITO film with a thickness of 0.1 µm was formed by a sputtering method as the first electrode 501.

In this embodiment, a method for forming the transparent conductive film to electrically connect with the wiring 507 after forming the wiring 507 was described, but the transparent conductive film may be formed by another method. For example, the wiring 507 of the TFT may be formed to electrically connect with the first electrode after forming the transparent conductive film and forming the first electrode by patterning the transparent conductive film. In addition, after forming the wiring 507 of the TFT, an insulating film is formed over the wiring 507, and thereafter, a contact hole is formed in the insulating film to reach the wiring 507. Then, the transparent conductive film may be formed to electrically connect with the wiring 507 through the contact hole.

Subsequently, an insulating film 504 is formed to cover an end face of the first electrode 501. There is no particular limitation on a material for forming the insulating film 504, and the insulating film 504 can be made of an inorganic or organic material. The insulating film 504 is preferably made of a photosensitive organic material since a shape of the opening portion provided for the insulating film 504 becomes such a shape that disconnection in a light emitting layer to be evaporated over the insulating film 504 is hardly caused. Namely, the shape of the opening portion provided for the insulating film 504 can be made into such a gently curved shape that a slope of a surface on which the light emitting layer is formed continuously changes, thereby improving coverage of the light emitting layer and preventing disconnection in the light emitting layer. Consequently, a short circuit between an anode and a cathode due to breaking of a wiring of a light emitting element is reduced. In addition, the light emitting layer can be prevented from becoming thin partly and an electric field can be prevented from concentrating locally in the light emitting layer. A photosensitive polyimide resin, photosensitive acrylic, or the like can be used as the photosensitive organic material for forming the insulating film 504. For example, in the case of using a negative photosensitive resin as a material of the insulating film 504, a shape of an upper end portion of the insulating film 504 in contact with a top face of the first electrode 501 can be formed to be a curved shape that has a center of curvature below a tangent to a top face of the insulating film 504 and the upper end portion of the insulating film 504 and is determined by a first curvature radius. A shape of a lower end portion of the insulating film 504 can be formed to be a curved shape that has a center of curvature above a tangent to the first electrode 501 and the lower end portion of the insulating film 504 and is determined by a second curvature radius. The first and the second curvature radii are preferable from 0.2 µm to 3 µm, and an angle of a side wall of the opening portion to the first electrode 501 is preferably equal to or more than 35°.

Subsequently, dust or the like is removed by wiping with a porous body of a PVA (polyvinyl alcohol) system. In this embodiment, fine powder (dust) generated in etching the first electrode 501 made of an ITO or the insulating film 504 was removed by wiping with the porous body of PVA.

Subsequently, a light emitting layer 502 is formed to be in contact with the first electrode 501. The light emitting layer 502 is formed by an evaporation method or an application method (a spin coating method, an ink-jetting method, or the like). In this embodiment, a method for evaporating with an evaporation source moving was employed. In this method, an organic compound which is a material of the light emitting layer 502 and is put in the evaporation source is vaporized in advance by resistance heating, and a shutter is provided to prevent the vaporized organic compound from being scattered in a direction of the glass substrate 20 from the evaporation source. In evaporating, the vaporized organic compound was scattered upwardly by opening the shutter and was evaporated over the glass substrate 20 through an opening portion provided for a metal mask, thereby forming the light emitting layer 502.

Note that PEDOT may be entirely applied and may be baked as treatment before evaporation of the light emitting layer 502. It is preferable to wash PEDOT after PEDOT is once applied and to apply PEDOT again since PEDOT has poor wettability with ITO that is the first electrode 501. In this way, after applying PEDOT, a heat treatment is performed at normal pressure to vaporize moisture, and then, a heat treatment is performed under reduced pressure.

One of or a plurality of layers to be provided between the first electrode and a second electrode forming a light emitting element is generically referred to as the light emitting layer (layer including a light emitting material) 502. The light emitting layer 502 can be formed by using a low molecular weight organic compound material, a high molecular weight organic compound material, or a mixture thereof appropriately. Further, a mixed layer in which an electron transporting material and a hole transporting material are appropriately mixed, or a mixed bonding in which a mixed region is formed at a bond interface of each material may be formed. In addition to an organic material, an inorganic light emitting material may be used. Further, a laminate structure of the light emitting layer 502 is not particularly limited, and a structure in which layers made of a low molecular weight material are laminated or a structure in which a layer made of a high molecular weight material and a layer made of a low molecular weight material are laminated may be adopted.

Subsequently, a second electrode 503 is formed over the light emitting layer 502. The second electrode 503 is made of a laminated film of a thin film containing metal having a small work function (Li, Mg, or Cs) and a transparent conductive film laminated over the thin film containing Li, Mg, or the like. The film thickness is properly set to function as a cathode, but here, it is set at approximately from 0.01 μm to 1 μm in thickness by a known method (an electron beam evaporation method or the like). However, in the case of employing an electron beam evaporation method, radiation is generated when an acceleration voltage is too high, and thus, a TFT is damaged. However, when an acceleration voltage is too low, film formation speed is slowed down and productivity decreases. Therefore, the second electrode 503 is formed so as not to be excessively thicker than such a film thickness that the second electrode functions as a cathode. When the second electrode 503 is thin, the productivity is not affected significantly even if the film formation speed is slow. However, a problem of increase in resistance arises when the cathode is thin. The problem can be solved by forming Al or the like which is a low-resistance metal over the cathode by resistance heating evaporation or a sputtering method to be a laminated structure. In this embodiment, Al—Li was formed to be 0.1 μm in thickness as the second electrode 503 by an electron beam evaporation method.

Subsequently, a protective film 505 is formed over the insulating film 504 and the second electrode 503. A film that is hardly penetrated, compared to other insulating films, by a substance such as moisture or oxygen to be a cause of accelerating deterioration of a light emitting element 506 is used as the protective film 505. Typically, a DLC film, a carbon nitride film, a silicon nitride film formed by an RF sputtering method, or the like is preferably used. In addition, film thickness thereof is preferably approximately from 10 nm to 200 nm. In this embodiment, a silicon nitride film was formed to have a thickness of 100 nm by a sputtering method.

A laminate of the first electrode 501, the light emitting layer 502, and the second electrode 503, which is formed in the above-described steps, corresponds to the light-emitting element 506. The first electrode 501 corresponds to an anode, and the second electrode 503 corresponds to a cathode. In the present invention, there are singlet excitation and triplet excitation as an excitation state of the light emitting element 506, and luminescence can be generated through either excitation state.

Figure 4:
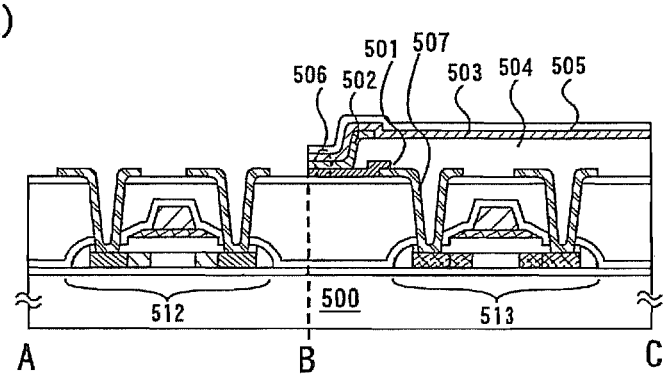
FIGS. 4A-4C are diagrams showing a pixel structure of a display panel according to the present invention.
Figure 4:
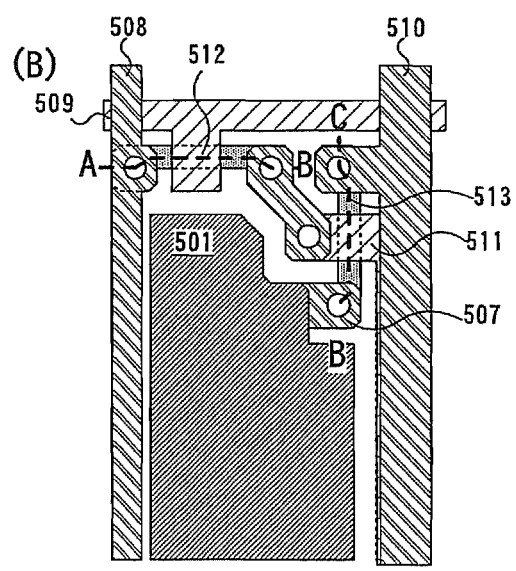
Figure 4:
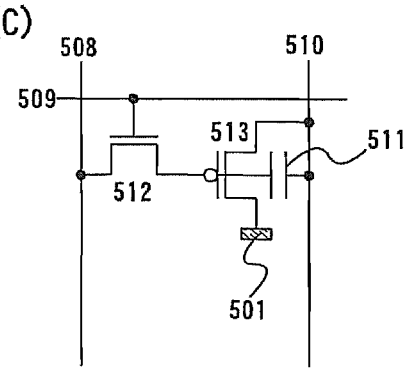

FIG. 4(B) shows a top view of one pixel in a display device using a light emitting element. FIG. 4(B) shows a state that up to a pixel electrode 501 is formed. In the top view of FIG. 4(B), a cross sectional view equivalent to A-B-C corresponds to FIG. 5(A). Further, FIG. 4(C) shows a circuit diagram of one pixel equivalent to FIG. 4(B). In FIGS. 4(B) and 4(C), reference numeral 508 denotes a source line; 509, a gate line; 510, a power source line; 511, a capacitor element; 501, the first electrode (pixel electrode); 512, a switching TFT; and 513, the driving TFT.

In this embodiment, a case where so-called bottom emission in which light emitted from the light emitting element 506 was extracted from a side of the substrate 500 was performed was described. However, so-called top emission in which light is extracted from a direction opposite to the substrate 500 may be performed, instead. In that case, the first electrode 501 is formed to correspond to the cathode, and the second electrode 503 is formed to correspond to the anode. Further, the second electrode 503 is preferably made of a transparent material. In addition, the driving TFT 513 is preferably made of an n-channel TFT. Note that a conductivity type of the driving TFT 513 may be appropriately changed, but the capacitor element 511 is arranged to hold voltage between the gate and the source. Note that the case of a light emitting device using the thin film transistor and the light emitting element of the present invention is described in this embodiment; however, the present invention can be applied to another display device such as a liquid crystal display device.

This embodiment can be freely combined with the above-described embodiment modes.

Embodiment 2

Figure 5:
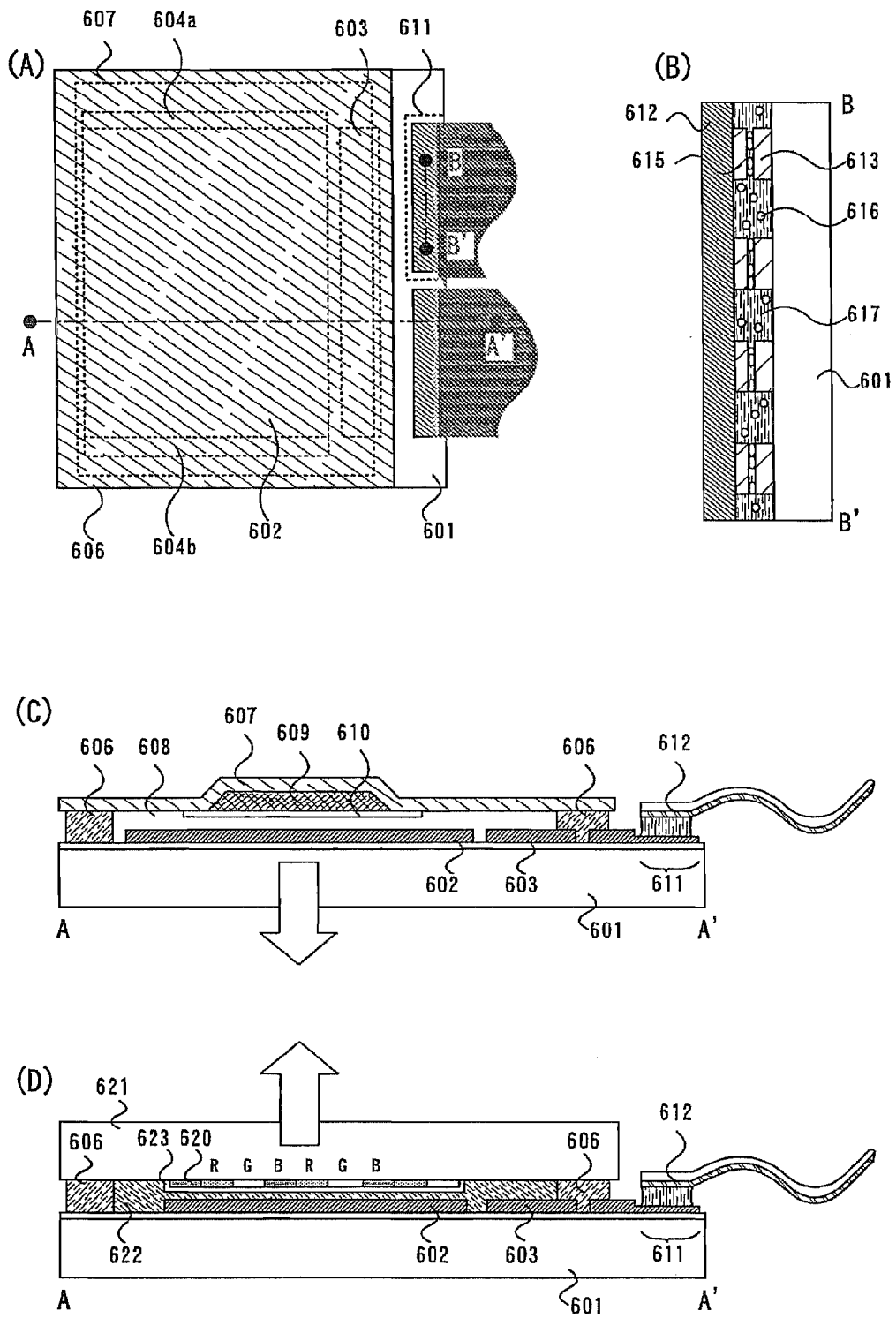
FIGS. 5A-5D are diagrams showing a structure of a display panel according to the present invention.

An embodiment of the present invention is described with reference to FIG. 5. FIG. 5(A) is a top view of a display panel formed by sealing a substrate over which a TFT is formed with a sealing material. FIG. 5(B) is a cross-sectional view along a line B-B' in FIG. 5(A). FIGS. 5(C) and 5(D) are cross-sectional views along a line A-A' in FIG. 5(A). Note that FIG. 5(C) is a cross-sectional view of a display panel performing bottom emission in which light is emitted in a direction of the substrate over which a TFT is formed. FIG. 5(D) is a cross-sectional view of a display panel performing top emission in which light is emitted in a direction opposite to the substrate over which a TFT is formed.

In FIGS. 5(A) to 5(D), a pixel portion (display portion) 602, a signal line driver circuit 603 which is disposed to surround the pixel portion 602, scanning line driver circuit 604*a*, and scanning line driver circuit 604*b* are all disposed over a substrate 601, and a seal material 606 is provided to surround all of them. The structure described in the above Embodiment 1, or the like can be applied to a structure of the pixel portion 602. A glass material, a metal material, a ceramic material, or a plastic material is used as the seal material 606. The seal material 606 may be provided to partially overlap the signal line driver circuit 603, the scanning line driver circuit 604*a*, and the scanning line driver circuit 604*b*.

In a display panel shown in FIG. 5(C), a sealing material 607 is provided by using the seal material 606 as an adhesive layer, so that a closed space 608 is formed with the substrate 601, the seal material 606, and the sealing material 607. A hygroscopic agent 609 is provided in advance for a depression of the sealing material 607, so that it has a function of absorbing moisture, oxygen, and the like to keep an atmosphere clean in an inner portion of the closed space 608, thereby suppressing deterioration of the light emitting element. The depression is covered with a cover material 610 with a fine mesh shape. The cover material 610 allows air and moisture to pass therethrough but not the hygroscopic agent 609. Note that the closed space 608 may be filled with a noble gas such as nitrogen or argon, or can be filled with a resin or a liquid as long as it is inert.

In a display panel in FIG. 5(D), a transparent opposing substrate 621 is provided by using the seal material 606 as an adhesive layer, so that a closed space 622 is formed with the substrate 601, the opposing substrate 621, and the seal material 606. The opposing substrate 621 is provided with a color filter 620 and a protective film 623 for protecting the color filter. Light emitted from the light emitting element disposed in the pixel portion 602 is exteriorly emitted through the color filter 620, and the display panel performs multicolor display. The closed space 622 is filled with an inert resin, an inert liquid, or the like. In the case of performing multi color display, the light emitting layer may be set to emit each color of RGB, or a pixel provided with a light emitting layer that emits white light may be arranged in order that the color filter or a color conversion layer is used.

An input terminal portion 611 for transmitting a signal to the signal line driver circuit 603, the scanning line driver circuit 604*a*, and the scanning line driver circuit 604*b* is provided over the substrate 601. A data signal such as a video signal is transmitted to the input terminal portion 611 through an FPC 612. A cross section of the input terminal portion 611 is as shown in FIG. 5(B), and an input wiring 613 made of a wiring which is formed together with the scanning line or the signal line is electrically connected to a wiring 615 provided on a side of the FPC 512 by using a resin 617 in which a conductive material 616 is dispersed. Note that a spherical high molecular weight compound plated with gold or silver may be used as the conductive material 616.

In this embodiment, an example of applying the present invention to the light-emitting panel using the light emitting element is described; however, the present invention may be applied to a liquid crystal panel using a liquid crystal display element.

This embodiment can be freely combined with other above-described embodiment modes and embodiments.

Embodiment 3

Figure 6:
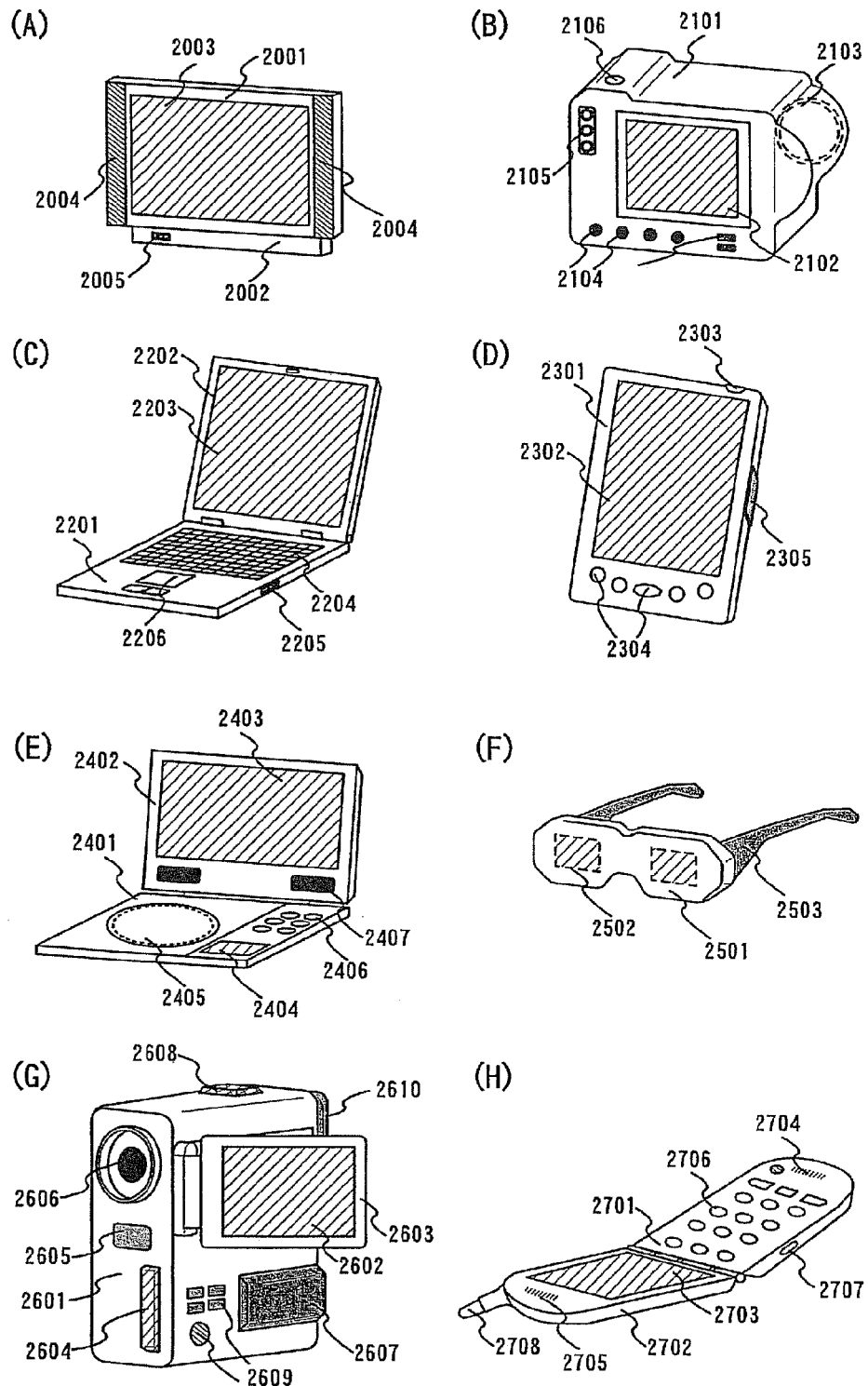
FIGS. 6A-6H are diagrams showing structures of electronic apparatuses according to the present invention.
Figure 7:
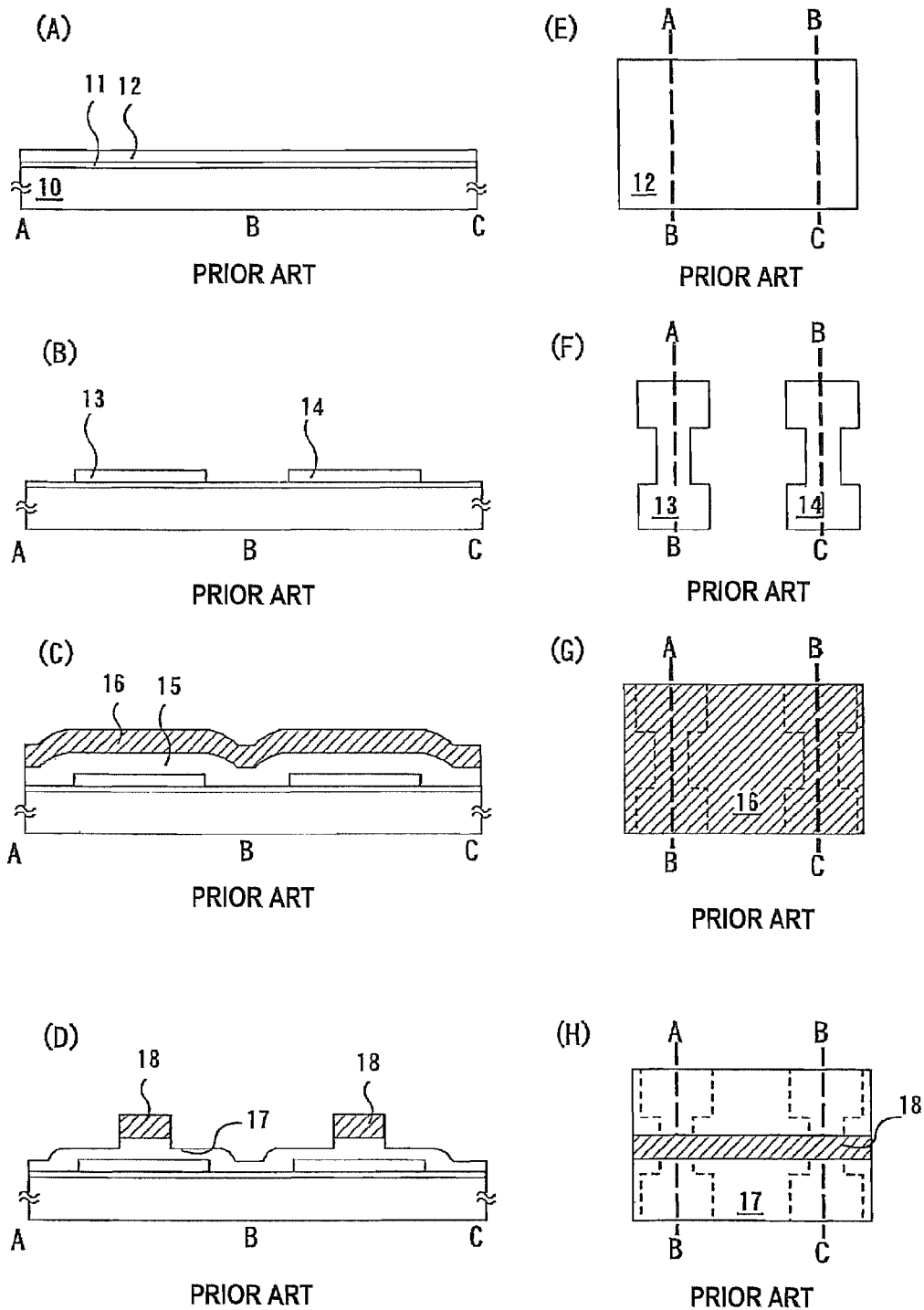
FIGS. 7A-7H are diagrams showing a step of manufacturing a thin film transistor in which element isolation is performed on a semiconductor film before forming a gate insulating film.

The following can be given as examples of electronic apparatuses to which the present invention is applied: a video camera; a digital camera; a goggle type display; a navigation system; an audio reproducing device (car audio, or the like); a laptop computer; a game machine; a personal digital assistant (a mobile computer, a cellular phone, or the like); an image reproducing device including a recording medium; and the like. Practical examples of these electronic apparatuses are shown in FIG. 6.

FIG. 6(A) shows a light emitting device, which includes a chassis 2001, a supporting section 2002, a display portion 2003, speaker portions 2004, a video input terminal 2005, and the like. The present invention can be applied to the display portion 2003. The light emitting device is self-luminous and does not need a backlight, so that the display portion can be made thinner than that of a liquid crystal display. Note that the light emitting device includes all display devices for displaying information, including ones for personal computers, for TV broadcasting reception, and for advertisement.

FIG. 6(B) shows a digital still camera, which includes a main body 2101, a display portion 2102, an image receiving portion 2103, operation keys 2104, an external connection port 2105, a shutter 2106, and the like. The present invention can be applied to the display portion 2102.

FIG. 6(C) shows a laptop personal computer, which includes a main body 2201, a chassis 2202, a display portion 2203, a keyboard 2204, an external connection port 2205, a pointing mouse 2206, and the like. The present invention can be applied to the display portion 2203.

FIG. 6(D) shows a mobile computer, which includes a main body 2301, a display portion 2302, an electric switch 2303, operation keys 2304, an infrared port 2305, and the like. The present invention can be applied to the display portion 2302.

FIG. 6(E) shows a portable image reproducing device including a recording medium (specifically, a DVD reproducing device), which includes a main body 2401, a chassis 2402, a display portion A 2403, a display portion B 2404, a recording medium reading portion 2405, operation keys 2406, speaker portions 2407, and the like. The display portion A 2403 mainly displays image information whereas the display portion B 2404 mainly displays text information. The present invention can be applied to the display portion A 2403 and the display portion B 2404.

FIG. 6(F) shows a goggle type display (head mounted display), which includes a main body 2501, display portions 2502, and arm portions 2503. The present invention can be applied to the display portions 2502.

FIG. 6(G) shows a video camera, which includes a main body 2601, a display portion 2602, a chassis 2603, an external connection port 2604, a remote control receiving portion 2605, an image receiving portion 2606, a battery 2607, an audio input portion 2608, operation keys 2609, an eye piece portion 2610, and the like. The present invention can be applied to the display portion 2602.

FIG. 6(H) shows a cellular phone, which includes a main body 2701, a chassis 2702, a display portion 2703, an audio input portion 2704, an audio output portion 2705, operation keys 2706, an external connection port 2707, an antenna 2708, and the like. The present invention can be applied to the display portion 2703. Note that if the display portion 2703 displays white letters on black background, the cellular phone consumes less power.

As described above, the applicable range of the present invention is so wide that the invention can be applied to electronic devices of various fields. In addition, the electronic devices of this embodiment can be freely combined with the above embodiment modes and embodiments.

Advantageous Effect of the Invention

According to the present invention, a gate insulating film can be heat-treated without an alignment defect in patterning even at a temperature of 700° C. that conventionally causes a problem of alignment in patterning due to shrinkage of a substrate such as glass.

By heat-treating a gate insulating film at a temperature of 700° C. above a strain point of glass, an interface level is lowered; a fixed charge is reduced; a gate leakage current is lowered; field-effect mobility, subthreshold coefficient, and the like become favorable; a change of transistor characteristics over time during continuous operation is reduced; a yield is improved; and variation in the characteristics is reduced, in a thin film transistor.

What is claimed is:

1. A thin film transistor comprising:
    an island-shaped semiconductor film over a substrate, a side face of the island-shaped semiconductor film comprising an insulating film;
    an island-shaped gate insulating film over the island-shaped semiconductor film; and
    a gate electrode over the island-shaped gate insulating film,
    wherein the island-shaped gate insulating film overlaps with the insulating film, and
    wherein a side face of the island-shaped gate insulating film and the side face of the island-shaped semiconductor film are substantially vertically aligned with each other.

2. A thin film transistor comprising:
    an island-shaped semiconductor film over a substrate, a side face of the island-shaped semiconductor film comprising an insulating film;
    an island-shaped gate insulating film over the island-shaped semiconductor film; and
    a gate electrode over the island-shaped gate insulating film,
    wherein the island-shaped gate insulated film covers the insulating film, and
    wherein a side face of the island-shaped gate insulating film and the side face of the island-shaped semiconductor film are substantially vertically aligned with each other.

3. An electronic apparatus comprising the thin film transistor according to claim 2,
    wherein the electronic apparatus is selected from the group consisting of a light emitting device, a digital still camera, a personal computer, a mobile computer, an image reproducing device, a goggle type display, a video camera, and a cellular phone.

4. A thin film transistor according to claim 2,
wherein the gate electrode is not in contact with the insulating film.

5. A thin film transistor according to claim 2,
wherein the island-shaped semiconductor film is a crystalline semiconductor film.

6. A thin film transistor comprising:
an island-shaped semiconductor film over a substrate a side face of the island-shaped semiconductor film comprising an insulating film;
an island-shaped gate insulating film over the island-shaped semiconductor film; and
a gate electrode over the island-shaped gate insulating film,
wherein the island-shaped gate insulating film covers the insulating film,
wherein the insulating film comprises an oxide insulating film, a nitride insulating film or an oxynitride insulating film, and
wherein a side face of the island-shaped gate insulating film and the side face of the island-shaped semiconductor film are substantially vertically aligned with each other.

7. An electronic apparatus comprising the thin film transistor according to claim 6,
wherein the electronic apparatus is selected from the group consisting of a light emitting device, a digital still camera, a personal computer, a mobile computer, an image reproducing device, a goggle type display, a video camera, and a cellular phone.

8. A thin film transistor according to claim 6,
wherein the gate electrode is not in contact with the insulating film.

9. A thin film transistor according to claim 6,
wherein the island-shaped semiconductor film is a crystalline semiconductor film.

10. A thin film comprising:
an island-shaped semiconductor film over a substrate, all side faces of the island-shaped semiconductor film comprising an insulating film;
an island-shaped gate insulating film over the island-shaped semiconductor film; and
a gate electrode over the island-shaped gate insulating film,
wherein the island-shaped gate insulating film covers the insulating film,
wherein the insulating film comprises an oxide insulating film, a nitride insulating film, or an oxynitride insulating film, and
wherein all sides faces of the island-shaped gate insulating film and all the side faces of the island-shaped semiconductor film are substantially vertically aligned with each other.

11. An electronic apparatus comprising the thin film transistor according to claim 10,
wherein the electronic apparatus is selected from the group consisting of a light emitting device, a digital still camera, a personal computer, a mobile computer, an image reproducing device, a goggle type display, a video camera, and a cellular phone.

12. A thin film transistor according to claim 10,
wherein the gate electrode is not in contact with the insulating film.

13. A thin film transistor according to claim 10,
wherein the island-shaped semiconductor film is a crystalline semiconductor film.

* * * * *